US012216907B2

United States Patent
Luo et al.

(10) Patent No.: US 12,216,907 B2
(45) Date of Patent: Feb. 4, 2025

(54) METHOD OF IMPROVING PROGRAMMING OPERATIONS IN 3D NAND SYSTEMS

(71) Applicant: Yangtze Memory Technologies Co., Ltd., Hubei (CN)

(72) Inventors: Zhe Luo, Hubei (CN); Da Li, Hubei (CN); Feng Xu, Hubei (CN); Yaoyao Tian, Hubei (CN); Jianquan Jia, Hubei (CN); XiangNan Zhao, Hubei (CN)

(73) Assignee: YANGTZE MEMORY TECHNOLOGIES CO., LTD., Hubei (CN)

( * ) Notice: Subject to any disclaimer, the term of this patent is extended or adjusted under 35 U.S.C. 154(b) by 0 days.

(21) Appl. No.: 18/082,265

(22) Filed: Dec. 15, 2022

(65) Prior Publication Data
US 2024/0168640 A1    May 23, 2024

(30) Foreign Application Priority Data
Nov. 23, 2022   (CN) .......................... 202211487045.7

(51) Int. Cl.
*G06F 3/06* (2006.01)
*G11C 16/04* (2006.01)
*G11C 16/10* (2006.01)

(52) U.S. Cl.
CPC .......... *G06F 3/0613* (2013.01); *G06F 3/0629* (2013.01); *G06F 3/0679* (2013.01); *G11C 16/0483* (2013.01); *G11C 16/10* (2013.01)

(58) Field of Classification Search
None
See application file for complete search history.

(56) References Cited

U.S. PATENT DOCUMENTS

| | | | |
|---|---|---|---|
| 2005/0083735 A1* | 4/2005 | Chen .................. | G11C 16/3459 365/185.17 |
| 2006/0104120 A1* | 5/2006 | Hemink ................. | G11C 16/10 365/185.28 |
| 2010/0103734 A1* | 4/2010 | Hemink ............. | G11C 16/3468 365/185.03 |
| 2012/0287720 A1* | 11/2012 | Choi .................. | G11C 16/3454 365/185.18 |
| 2016/0125935 A1* | 5/2016 | Lee ........................ | G11C 16/10 365/185.03 |
| 2020/0185047 A1* | 6/2020 | Lee ........................ | G11C 16/08 |

* cited by examiner

*Primary Examiner* — Kaushikkumar M Patel
(74) *Attorney, Agent, or Firm* — Conley Rose, P.C.

(57) ABSTRACT

The present disclosure provides a method for performing a programming operation on a memory cell connected to a bit line and controlled by a word line. The method includes applying a first programming voltage signal to the word line to program the memory cell into a first state, applying a first voltage to the bit line, performing a verify operation when the memory cell is in a second state, determining a classification of the memory cell based on the verify operation, applying a second voltage to the bit line based on the determined classification, applying a second programming voltage signal to the word line to program the memory cell into the first state, applying a third voltage to the bit line, applying a third programming voltage signal to the word line to program the memory cell into the first state, and applying a fourth voltage to the bit line.

20 Claims, 11 Drawing Sheets

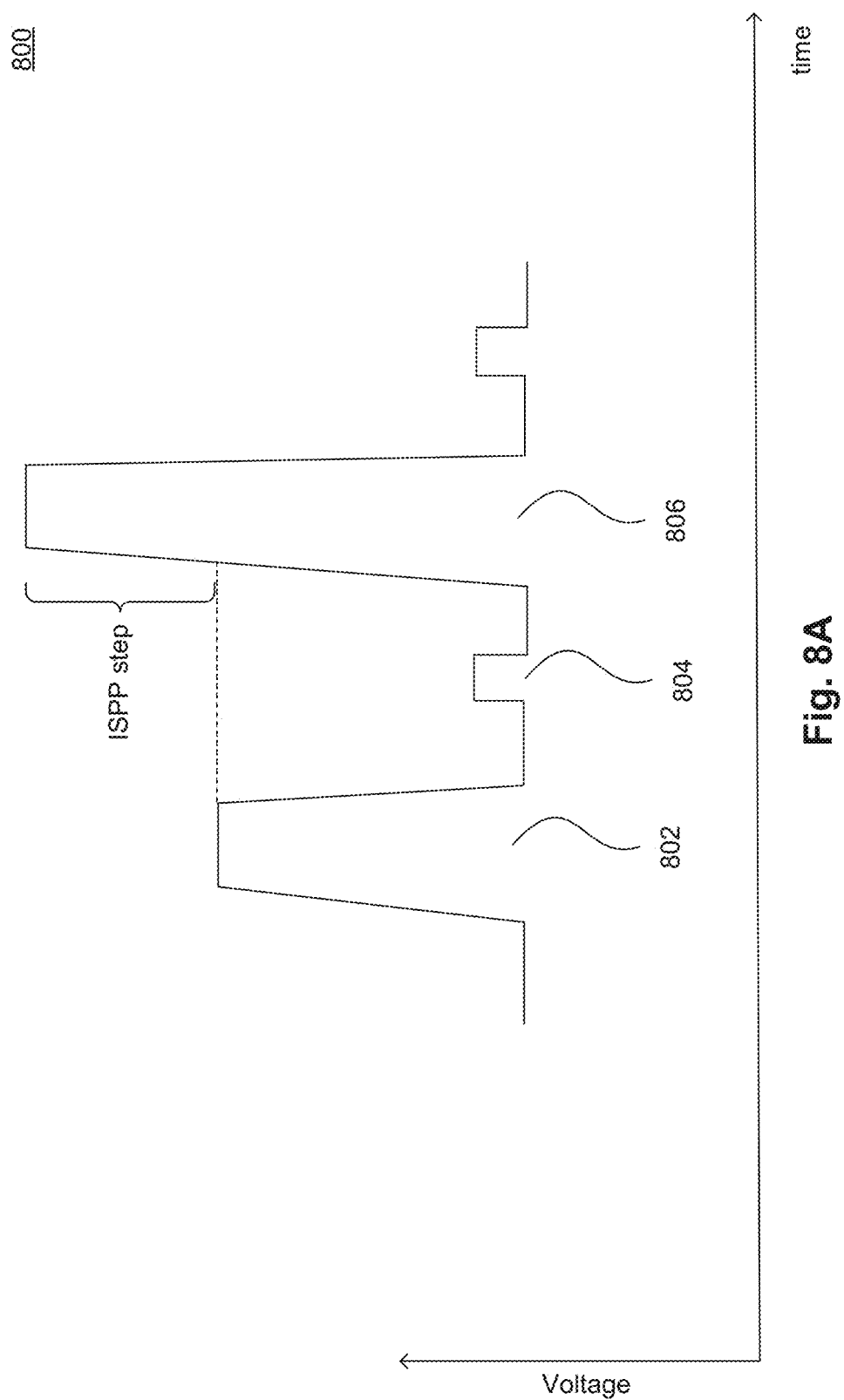

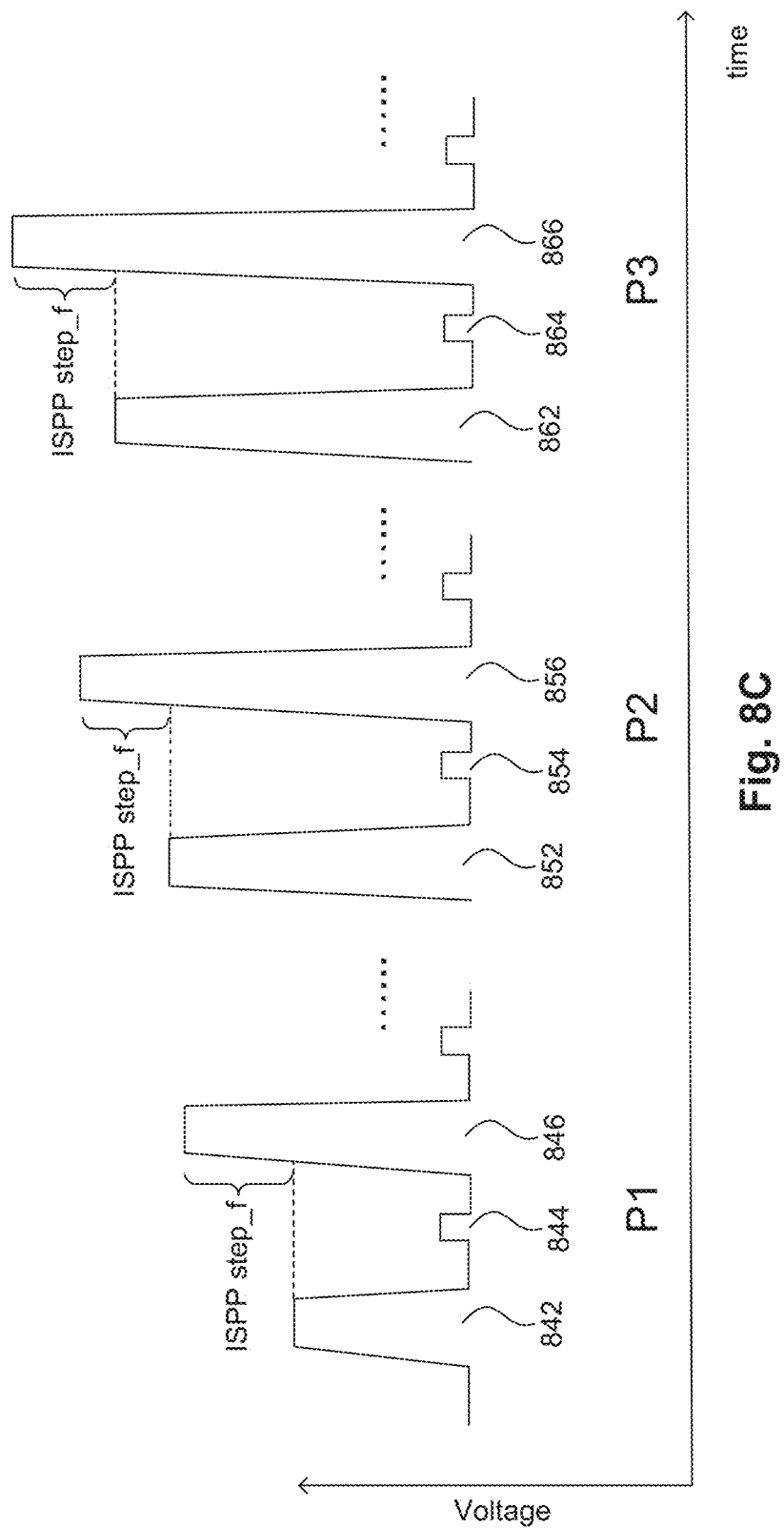

METHOD OF IMPROVING PROGRAMMING OPERATIONS IN 3D NAND SYSTEMS

CROSS-REFERENCE TO RELATED APPLICATIONS AND INCORPORATED BY REFERENCE

This application claims priority to Chinese Patent Application No. 202211487045.7 filed on Nov. 23, 2022, which is incorporated herein by reference in its entirety.

TECHNICAL FIELD

This description generally relates to the field of semiconductor technology, and more particularly, to a method for improving programming operations in 3D NAND memory.

BACKGROUND

A memory device, such as a flash memory chip, can program a memory cell of the memory device by applying a voltage, such as a programming voltage, to the memory cell. An incremental step pulse programming (ISPP) scheme can be applied where the programming voltage can be incrementally increased by adding a step pulse. The memory device then verifies whether or not the memory cell satisfies a voltage range or a required voltage. For example, the memory device can apply one or more reference voltages to the memory cell to determine a threshold voltage of the memory cell and compare the threshold voltage to the voltage range or the required voltage. In some aspects, memory cells in a same memory page of the memory device shared the same word line and can be programmed simultaneously.

BRIEF SUMMARY

Some aspects of this disclosure relate to memory devices and methods for programming operations. For example, the memory devices and the methods are provided for improving the efficiency of programming operations.

Some aspects of this disclosure relate to a method for programming a memory device. The method includes performing a programming operation on a memory cell. The memory cell is connected to a bit line and is controlled by a word line. The performing the programming operation includes applying a first programming voltage signal to the word line to program the memory cell into a first state. The performing the programming operation can also include applying a first voltage to the bit line. The performing the programming operation can also include performing a verify operation when the memory cell is in a second state. The performing the programming operation can also include determining a classification of the memory cell based on the verify operation. The performing the programming operation can also include applying a second voltage to the bit line based on the determined classification. The performing the programming operation can also include applying a second programming voltage signal to the word line to program the memory cell into the first state. The performing the programming operation can also include applying a third voltage to the bit line. The performing the programming operation can also include applying a third programming voltage signal to the word line to program the memory cell into the first state. The performing the programming operation can further include applying a fourth voltage to the bit line.

According to some aspects, the applying the first voltage can include applying a voltage larger than zero.

According to some aspects, a target voltage of the second state can be lower than the target voltage of the first state.

According to some aspects, the performing the verify operation can include comparing a threshold voltage of the memory cell with a read reference voltage. The read reference voltage can be a verify voltage of the second state.

According to some aspects, the determining a classification of the memory cell based on the verify operation can include determining a classification of the memory cell as a first classification when the threshold voltage is larger than the read reference voltage. Alternatively, the determining a classification of the memory cell based on the verify operation can include determining a classification of the memory cell as a second classification when the threshold voltage is smaller than the read reference voltage.

According to some aspects, the applying the second voltage can be applied so as to be equal to the first voltage based on the determined first classification of the memory cell, or as a zero voltage based on the determined second classification of the memory cell.

According to some aspects, the third voltage can be larger than the second voltage.

Some aspects of this disclosure relate to a three-dimensional (3D) NAND memory device. A 3D NAND memory device can include a NAND string including a cell to be inhibited to program, a word line driver, a bit line driver; and a controller. The controller can be configured to control the word line driver and the bit line driver to apply a first programming voltage signal to the word line to program the memory cell into a first state. The controller can also be configured to apply a first voltage to the bit line. The controller can also be configured to perform a verify operation when the memory cell is in a second state. The controller can also be configured to determine a classification of the memory cell based on the verify operation. The controller can also be configured to apply a second voltage to the bit line based on the determined classification. The controller can also be configured to apply a second programming voltage signal to the word line to program the memory cell into the first state. The controller can also be configured to apply a third voltage to the bit line. The controller can also be configured to apply a third programming voltage signal to the word line to program the memory cell into the first state. The controller can further be configured to apply a fourth voltage to the bit line.

According to some aspects, the applying the first voltage can include applying a voltage larger than zero.

According to some aspects, a target voltage of the second state can be lower than the target voltage of the first state.

According to some aspects, the performing the verify operation can include comparing a threshold voltage of the memory cell with a read reference voltage. The read reference voltage can be a verify voltage of the second state.

According to some aspects, the determining a classification of the memory cell based on the verify operation can include determining a classification of the memory cell as a first classification when the threshold voltage is larger than the read reference voltage. Alternatively, the determining a classification of the memory cell based on the verify operation can include determining a classification of the memory cell as a second classification when the threshold voltage is smaller than the read reference voltage.

According to some aspects, the applying the second voltage can be applied so as to be equal to the first voltage based on the determined first classification of the memory cell, or as a zero voltage based on the determined second classification of the memory cell.

According to some aspects, the third voltage can be larger than the second voltage.

Some aspects of this disclosure relate to a non-transitory medium having instructions stored thereon that, upon execution by at least one controller, cause the at least one controller to perform a method of performing a programming operation of a memory device. The method includes performing a programming operation on a memory cell. The memory cell is connected to a bit line and is controlled by a word line. The performing the programming operation includes applying a first programming voltage signal to the word line to program the memory cell into a first state. The performing the programming operation can also include applying a first voltage to the bit line. The performing the programming operation can also include performing a verify operation when the memory cell is in a second state. The performing the programming operation can also include determining a classification of the memory cell based on the verify operation. The performing the programming operation can also include applying a second voltage to the bit line based on the determined classification. The performing the programming operation can also include applying a second programming voltage signal to the word line to program the memory cell into the first state. The performing the programming operation can also include applying a third voltage to the bit line. The performing the programming operation can also include applying a third programming voltage signal to the word line to program the memory cell into the first state. The performing the programming operation can further include applying a fourth voltage to the bit line.

According to some aspects, the applying the first voltage can include applying a voltage larger than zero.

According to some aspects, a target voltage of the second state can be lower than the target voltage of the first state.

According to some aspects, the performing the verify operation can include comparing a threshold voltage of the memory cell with a read reference voltage. The read reference voltage can be a verify voltage of the second state.

According to some aspects, the determining a classification of the memory cell based on the verify operation can include determining a classification of the memory cell as a first classification when the threshold voltage is larger than the read reference voltage. Alternatively, the determining a classification of the memory cell based on the verify operation can include determining a classification of the memory cell as a second classification when the threshold voltage is smaller than the read reference voltage.

According to some aspects, the applying the second voltage can be applied so as to be equal to the first voltage based on the determined first classification of the memory cell, or as a zero voltage based on the determined second classification of the memory cell.

According to some aspects, the third voltage can be larger than the second voltage.

This Summary is provided merely for purposes of illustrating some aspects to provide an understanding of the subject matter described herein. Accordingly, the above-described features are merely examples and should not be construed to narrow the scope or spirit of the subject matter in this disclosure. Other features, aspects, and advantages of this disclosure will become apparent from the following Detailed Description, Figures, and Claims.

BRIEF DESCRIPTION OF THE DRAWINGS

The accompanying drawings, which are incorporated herein and form part of the specification, illustrate the present disclosure and, together with the description, further serve to explain the principles of the disclosure and enable a person of skill in the relevant art(s) to make and use the disclosure.

FIG. 8A illustrates an example method 800 of programming using an incremental step pulse programming (ISPP) scheme, according to some embodiments.

FIG. 8C illustrates an example method 820 of fine programming, according to aspects of the present disclosure.

Figure 1:
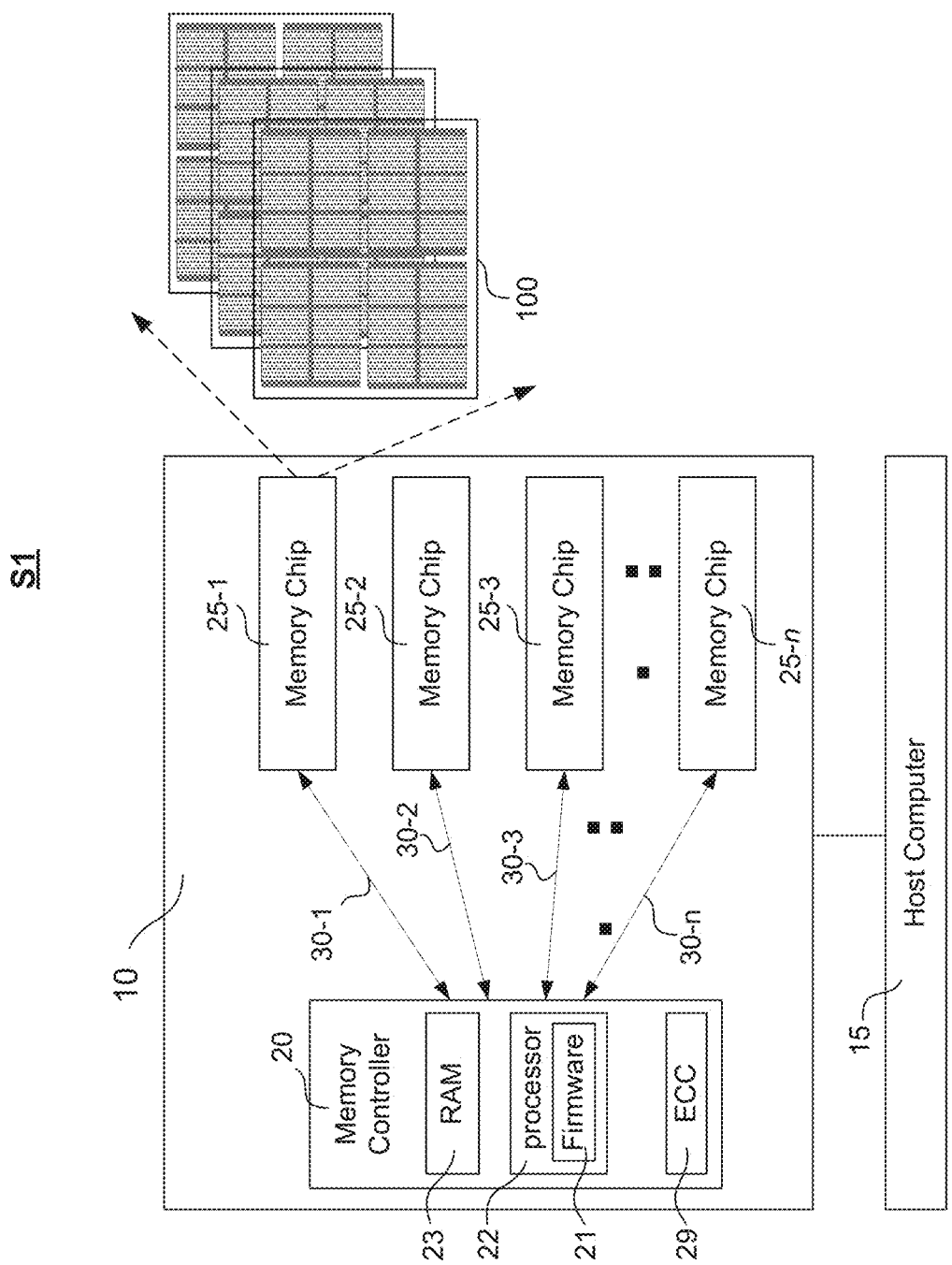
FIGS. 1 and 2A-2B illustrate a storage system with one or more memory chips, according to some embodiments.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements.

Aspects of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure, or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures, or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and can, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer there between. Moreover, "above" or "over" not only means "above" or "over" something, but can also include the meaning it is "above" or "over" something with no intermediate feature or layer there between (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the terms "about" or "approximately" indicate the value of a given quantity that can vary based on a particular technology node associated with the subject semiconductor device. Based on the particular technology node, the terms "about" or "approximately" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

As described above, a memory device, such as a flash memory chip, can program a memory cell of the memory device by applying a voltage, such as a programming voltage, to the memory cell. An incremental step pulse programming (ISPP) scheme can be applied where the programming voltage can be incrementally increased by adding a step pulse. The memory device then verifies whether or not the memory cell satisfies a voltage range or a required voltage. For example, the memory device can apply one or more reference voltages to the memory cell to determine a threshold voltage of the memory cell and compare the threshold voltage to the voltage range or the required voltage. In some aspects, memory cells in a same memory page of the memory device shared the same word line and can be programmed simultaneously.

Currently, the total number of programming pulses and the verify loop counts required for ISPP programming may greatly limit the programming speed. In some examples, the total number of pulses required for ISPP programming may include a minimum number, depending on, for example, the programming voltage for a high target state and/or a starting programming voltage. Thus, a minimum time for ISPP programming may be needed.

In some examples, the programming speed of different cells is different, due to, for example, variations in fabrication processes. Among all the memory cells that need to be programmed to the highest target state, the cell with the slowest programming speed may limit the minimum number of programming pulses. Among all the cells that need to be programmed to the same target state, the difference in programming speed between the cell with the slowest programming speed and the cell with the fastest programming speed may determine the number of verify loop counts required to program to the target state. Thus, there is a need to improve programming operations, for example, to reduce the time to perform programming operations and improve writing speed.

FIG. 1 illustrates a block diagram of an electronic device S1 having a storage system 10, according to some embodiments. In some embodiments, the electronic device S1 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. Storage system 10 (e.g., a NAND storage system) can include a memory controller 20 and one or more semiconductor memory chips 25-1, 25-2, 25-3, . . . , 25-n. Each semiconductor memory chip 25 (hereafter just "memory chip") can be a NAND chip (e.g., "flash," "NAND flash" or "NAND"). Storage system 10 can communicate with a host computer 15 through memory controller 20, where memory controller 20 can be connected to one or more memory chips 25-1, 25-2, 25-3, . . . , 25-n, via one or more memory channels 30-1, 30-2, 30-3, . . . , 30-n. In some embodiments, each memory chip 25 can be managed by memory controller 20 via one or more memory channels 30-1, 30-2, 30-3, . . . , 30-n.

In some embodiments, host computer 15 can include a processor of an electronic device, such as a central processing unit (CPU), or a system-on-chip (SoC), such as an application processor (AP). Host computer 15 can send data to be stored at storage system 10 and/or can retrieve data from stored in storage system 10.

In some embodiments, memory controller 20 can handle I/O requests received from host computer 15, ensure data integrity and efficient storage, and manage memory chip 25. To perform these tasks, memory controller 20 can run firmware 21, which can be executed by one or more processors 22 (e.g., micro-controller units, CPU) of memory controller 20. For example, memory controller 20 can run firmware 21 to map logical addresses (e.g., address utilized by the host associated with host data) to physical addresses in memory chip 25 (e.g., actual locations where the data is stored). Controller 20 also runs firmware 21 to manage defective memory blocks in the memory chip 25, where the firmware 21 can remap the logical address to a different physical address, i.e., move the data to a different physical address. The controller 20 can also include one or more memories 23 (e.g., DRAM, SRAM, EPROM, etc.), which can be used to store various metadata used by the firmware 21. In some embodiments, the memory controller 20 can also perform error recovery through an error correction code (ECC) engine 29. ECC is used to detect and correct the raw bit errors that occur within each memory chip 25.

In some embodiments, the memory channels 30 can provide data and control communication between the memory controller 20 and each memory chip 25 via a data bus. The memory controller 20 can select one of the memory chip 25 according to a chip enable signal.

In some embodiments, each memory chip 25 in FIG. 1 can include one or more memory dies 100, where each memory die can be a 3D NAND memory.

Figure 2B:
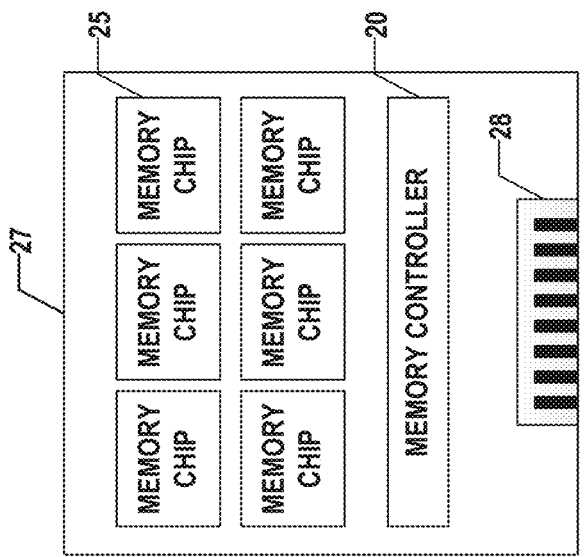
Figure 2A:
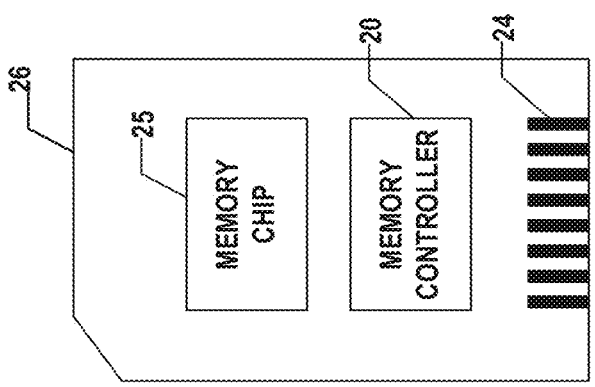

In some embodiments, memory controller 20 and one or more memory chip 25 can be integrated into various types of storage devices, for example, be included in the same package, such as a universal Flash storage (UFS) package or an eMMC package. That is, storage system 10 can be implemented and packaged into different types of end electronic products. In one example as shown in FIG. 2A, memory controller 20 and a single memory chip 25 can be integrated into a memory card 26. Memory card 26 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 26 can further include a memory card connector 24 coupling memory card 26 with a host (e.g., the host computer 15 in FIG. 1). In another example as shown in FIG. 2B, memory controller 20 and multiple memory chip 25 can be integrated into a solid state drive (SSD) 27. SSD 27 can further include a SSD connector 28 coupling SSD 27 with a host (e.g., the host computer 15 in FIG. 1).

Figure 3:
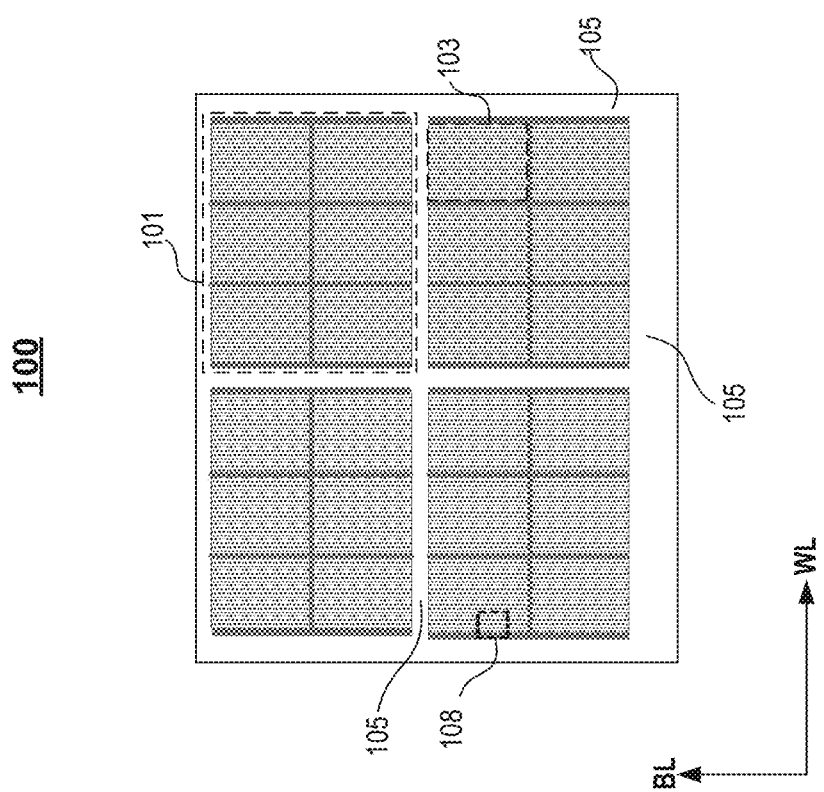
FIG. 3 illustrates a schematic diagram of a memory die, according to some embodiments.

FIG. 3 illustrates a top-down view of a memory die 100, according to some embodiments. The example configuration shown in FIG. 3 is given as a non-limiting example and it is to be appreciated that memory is scalable. In some embodiments, memory die 100 can include one or more memory planes 101, each of which can include a plurality of memory blocks 103. Identical and concurrent operations can take place at each memory plane 101. Memory block 103, which can be megabytes (MB) in size, is the smallest size to carry out erase operations. Memory die 100 can include, for example, four memory planes 101. Each memory plane 101 can include, for example, six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 3. In this disclosure, memory block 103 is also referred to as a "memory array" or "array." The memory array is the core area in a memory device, performing storage functions.

In some embodiments, memory die 100 can also include a periphery region 105, an area surrounding memory planes 101. The periphery region 105 can include many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

In some embodiments, the arrangement of the memory planes 101 in the memory die 100 and the arrangement of the memory blocks 103 in each memory plane 101 illustrated in FIG. 3 are only used as an example, which does not limit the scope of the present disclosure.

Figure 4:
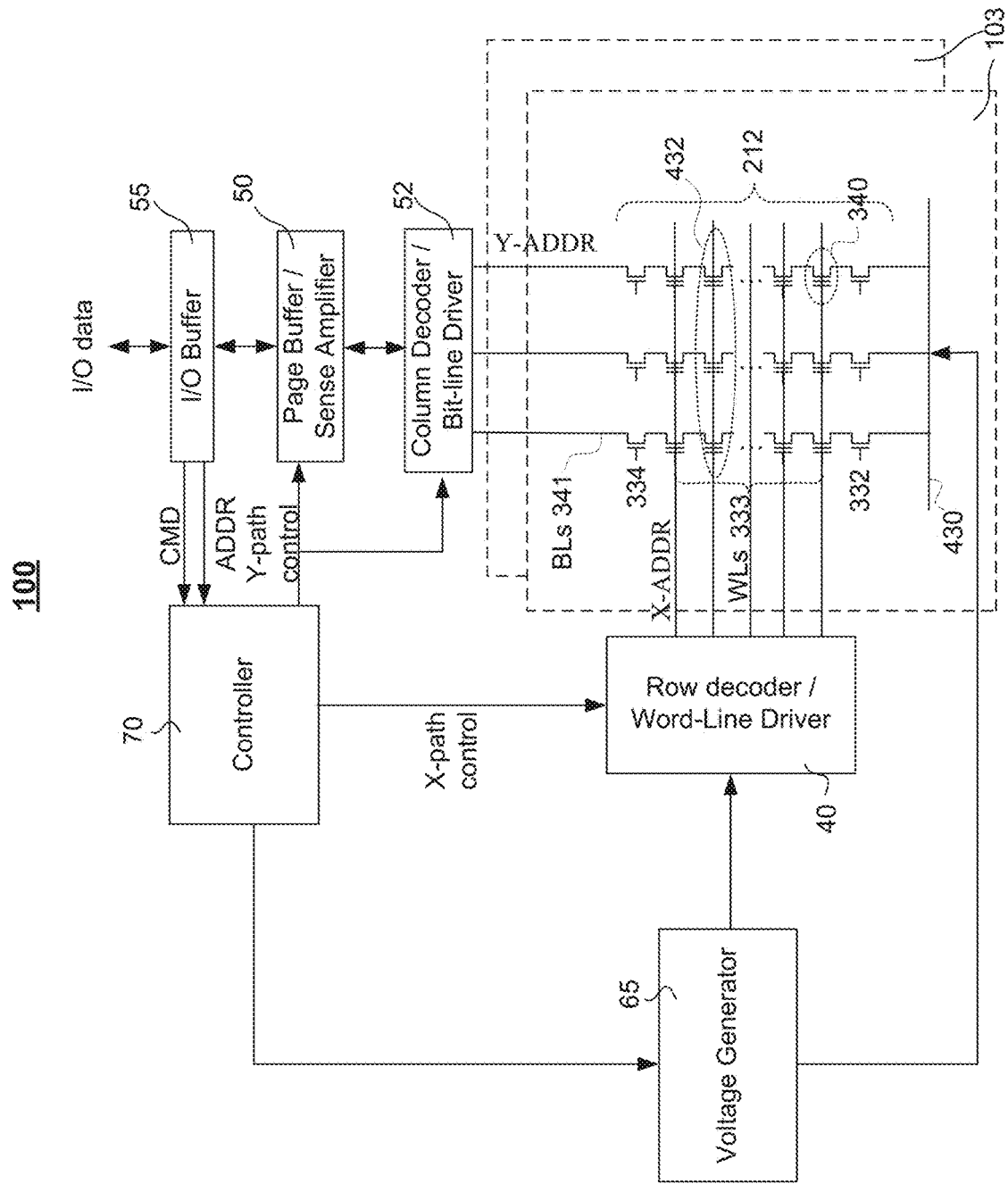
FIG. 4 illustrates a schematic of a three-dimensional (3D) memory die, according to some embodiments.

FIG. 4 illustrates a schematic diagram of the memory die 100, according to some embodiments. In some embodiments, memory die 100 can include one or more memory blocks 103 (e.g., 103-1, 103-2, 103-3). Each memory block 103 can include a plurality of memory strings 212. Each memory string 212 includes a plurality of memory cells 340. Memory cells 340 sharing the same word line forms a memory page 432. Memory string 212 can also include at least one field effect transistor (e.g., MOSFET) at each end, which is controlled by a lower select gate ("LSG") 332 and a top select gate ("TSG") 334, respectively. Lower select gates ("LSGs") can also be referred to as bottom select gates ("BSGs"). The drain terminal of the top select transistor 334-T can be connected to a bit line 341, and the source terminal of the lower select transistor 332-T can be connected to an array common source ("ACS") 430. ACS 430 can be shared by the memory strings 212 in an entire memory block, and is also referred to as the common source line.

In some embodiments, memory die 100 can also include a periphery circuit that can include many digital, analog, and/or mixed-signal circuits to support functions of the memory block 103, for example, a page buffer/sense amplifier 50, a row decoder/word line driver 40, a column decoder/bit line driver 52, a controller 70, a voltage generator 65 and an input/output buffer 55. Controller 70 can include one or more control circuits. In some aspects, controller 70 can include one or more registers, buffers, and/or memories to store one or more trim settings as described in the present disclosure. These circuits can include active and/or passive semiconductor devices, such as transistors, diodes, capacitors, resistors, etc., as would be apparent to a person of ordinary skill in the art.

In some embodiments, memory blocks 103 can be coupled with the row decoder/word line driver 40 via word lines ("WLs") 333, lower select gates ("LSGs") 332 and top select gates ("TSGs") 334. Memory blocks 103 can be coupled with page buffer/sense amplifier 50 via bit lines ("BLs") 341. Row decoder/word line driver 40 can select one of the memory blocks 103 on the memory die 100 in response to an X-path control signal provided by the controller 70. Row decoder/word line driver 40 can transfer voltages provided from the voltage generator 65 to the word lines according to the X-path control signal. During the read and program operation, the row decoder/word line driver 40 can transfer a read voltage $V_{read}$ and a program voltage $V_{pgm}$ to a selected word line and a pass voltage $V_{pass}$ to an unselected word line according to the X-path control signal received from the controller 70.

In some embodiments, column decoder/bit line driver 52 can transfer an inhibit voltage $V_{inhibit}$ to an unselected bit line and connect a selected bit line to ground according to a Y-path control signal received from controller 70. In the other words, column decoder/bit line driver 52 can be configured to select or unselect one or more memory strings 212 according to the Y-path control signal from controller 70. The page buffer/sense amplifier 50 can be configured to read and program (write) data from and to the memory block 103 according to the control signal Y-path control from the controller 70. For example, the page buffer/sense amplifier 50 can store one page of data to be programmed into one memory page 432. In another example, page buffer/sense amplifier 50 can perform verify operations to ensure that the data has been properly programmed into each memory cell 340. In yet another example, during a read operation, page buffer/sense amplifier 50 can sense current flowing through the bit line 341 that reflects the logic state (i.e., data) of the memory cell 340 and amplify small signal to a measurable magnification.

In some embodiments, in order to increase the efficiency of a write operation, column decoder/bit line driver 52 can transfer a bias voltage $V_{bias}$ to a selected bit line according to a Y-path control signal from controller 70 and the data to be programmed from page buffer/sense amplifier 50.

In some embodiments, input/output buffer 55 can transfer the I/O data from/to the page buffer/sense amplifier 50 as well as addresses ADDR or commands CMD to the controller 70. In some embodiments, input/output buffer 55 can function as an interface between memory controller 20 (in FIG. 1) and memory die 100 on memory chip 25.

In some embodiments, controller 70 can control page buffer/sense amplifier 50 and row decoder/word line driver 40 in response to the commands CMD transferred by the input/output buffer 55. During the program operation, controller 70 can control row decoder/word line driver 40 and page buffer/sense amplifier 50 to program a selected memory cell. During the read operation, controller 70 can control row decoder/word line driver 40 and the page buffer/sense amplifier 50 to read a selected memory cell. The X-path control signal and the Y-path control signal include a row address X-ADDR and a column address Y-ADDR that can be used to locate the selected memory cell in the memory block 103. The row address X-ADDR can include a page index PD, a block index BD and a plane index PL to identify memory page 432, memory block 103, and memory plane 101 (in FIG. 3), respectively. The column address Y-ADDR can identify a byte or a word in the data of the memory page 432.

In some embodiments, voltage generator 65 can generate voltages to be supplied to word lines and bit lines under the control of controller 70. The voltages generated by voltage generator 65 include the read voltage $V_{read}$, the program voltage $V_{pgm}$, the pass voltage $V_{pass}$, the inhibit voltage $V_{inhibit}$, the bit line bias voltage $V_{bias}$, etc.

It is noted that the arrangement of the electronic components in the storage system 10 and the memory die 100 in FIGS. 1, 2A-2B, and 3-4 are shown as non-limiting examples. In some embodiments, storage system 10 and memory die 100 can have other layout and can include additional components. Components (e.g., controller 70, I/O buffer 55) on memory die 100 shown in FIG. 4 can also be moved off memory die 100, as a stand-alone electric component in the storage system 10. Components (e.g., controller 70, I/O buffer 55) on memory die 100 shown in FIG. 4 can also be moved to other components in storage system 10, for example, a portion of controller 70 can be combined with memory controller 20 and vice versa.

Figure 5:
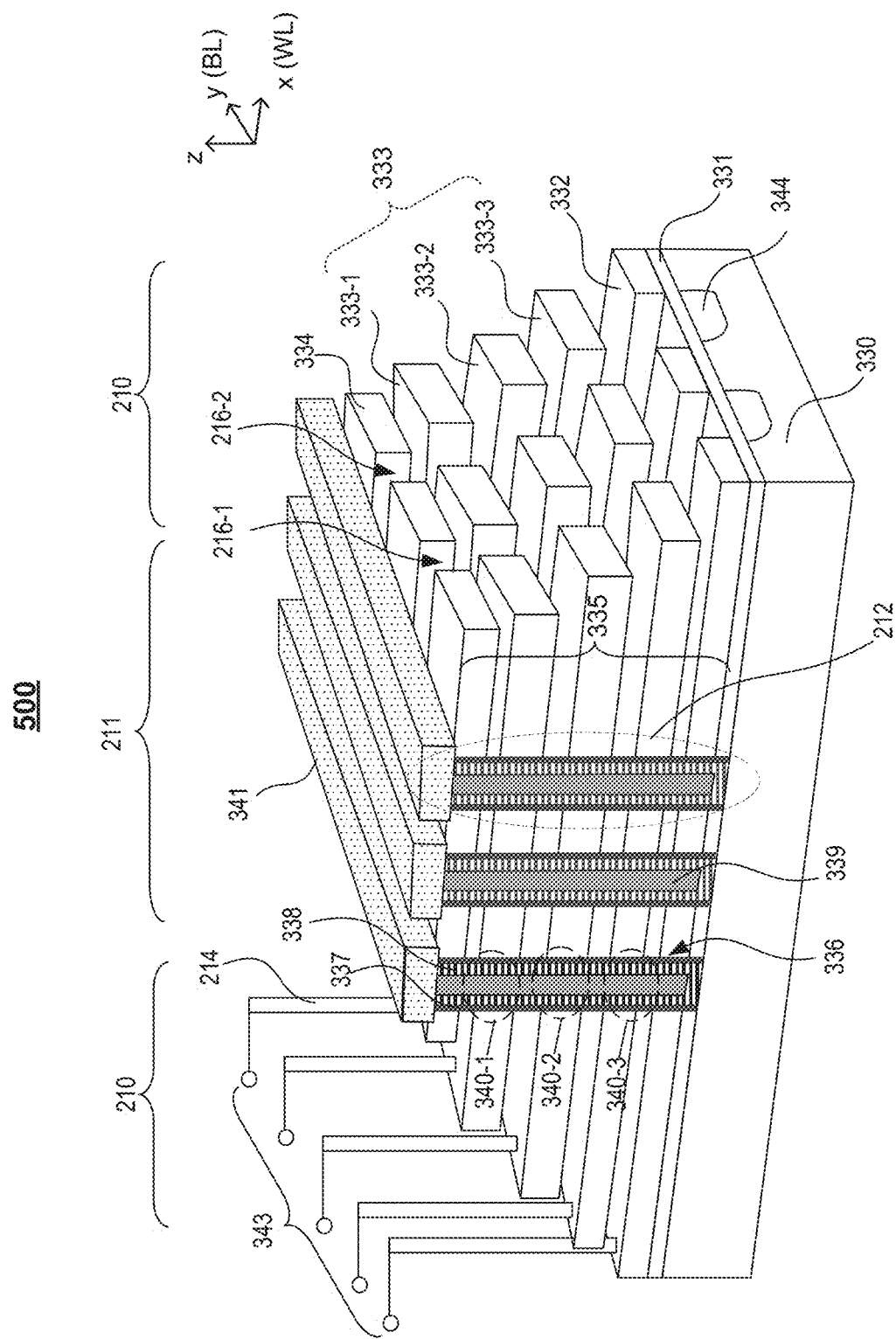
FIG. 5 illustrates a perspective view of a portion of a 3D memory structure, according to some embodiments.

FIG. 5 illustrates a perspective view of a 3D memory structure 500, according to some embodiments. In some embodiments, memory die 100 can be a 3D NAND memory, and the 3D memory structure 500 can be a portion of memory die 100, for example, in a region 108 in FIG. 3. The 3D memory structure 500 can include a staircase region 210 and a channel structure region 211. Channel structure region 211 can include a plurality of memory strings 212, each including a plurality of stacked memory cells 340. Staircase region 210 can include a staircase structure.

In some embodiments, the 3D memory structure 500 can include a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 5 for clarity.

In some embodiments, the control gates of each tier are separated by slit structures 216-1 and 216-2 through the film stack 335. The 3D memory structure 500 can also include a tier of top select gates (TSGs) 334 over the stack of control gates 333. The stack of TSG 334, control gates 333 and LSG 332 can also be referred to as "gate electrodes." The 3D memory structure 500 can further include doped source line regions 344 in portions of substrate 330 between adjacent LSGs 332. Each of memory strings 212 of the 3D memory structure 500 can include a channel hole 336 extending through the insulating film 331 and the film stack 335 of alternating conductive and dielectric layers. Memory string 212 can also include a memory film 337 on a sidewall of the channel hole 336, a channel layer 338 over memory film 337, and a core filling film 339 surrounded by channel layer 338. Memory cell 340 (e.g., 340-1, 340-2, 340-3) can be formed at the intersection of the control gate 333 (e.g., 333-1, 333-2, 333-3) and memory string 212. A portion of channel layer 338 can respond to the respective control gate and is also referred to as channel 338 of the memory cell. The 3D memory structure 500 further includes a plurality of bit lines (BLs) 341 connected with the memory strings 212 over the TSGs 334. The 3D memory structure 500 can also include a plurality of metal interconnect lines 343 connected with the gate electrodes through a plurality of contact structures 214. The edge of film stack 335 is configured in a shape of staircase to allow an electrical connection to each tier of the gate electrodes.

In FIG. 5, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to control gates 333-1, 333-2 and 333-3, respectively. In some embodiments, the number of control gates and the number of memory cells can be more than three to increase storage capacity. The 3D memory structure 500 can also include other structures, for example, TSG cut, common source contact (i.e., array common source) and dummy memory string. These structures are not shown in FIG. 5 for simplicity. It is noted that the 3D memory structure 500 shown in FIG. 5 is only used as an example, which does not limit the scope of the present disclosure, and any other suitable 3D memory structure can also be adapted.

Referring back to FIG. 4, in some embodiments, memory block 103 can be formed based on floating gate technology. In some embodiments, the memory block 103 can be formed based on charge trapping technology. The NAND flash memory based on charge trapping can provide high storage density and high intrinsic reliability. Storage data in the form of logic states ("states," e.g., threshold voltages $V_{th}$ of the memory cell 340) depends on the number of charge carriers trapped in the memory film 337 of the memory cell 340.

In some embodiments, in a NAND flash memory, a read operation and a write operation (also referred to as program operation) can be performed for the memory page 432, and an erase operation can be performed for the memory block 103.

In some embodiments, in a NAND memory, the memory cell 340 can be in an erased state ER or a programmed state P1. Initially, memory cells 340 in memory block 103 can be reset to the erased state ER as logic "1" by implementing a negative voltage difference between control gates 333 and channel 338 such that trapped charge carriers in the memory film of memory cells 340 can be removed. For example, the negative voltage difference can be induced by setting control gates 333 of memory cells 340 to ground, and applying a high positive voltage (an erase voltage $V_{erase}$) to ACS 430. At the erased state ER ("state ER"), the threshold voltage $V_{th}$ of memory cells 340 can be reset to the lowest value.

In some embodiments, during programming (i.e., writing), a positive voltage difference between control gates 333 and channel 338 can be established by, for example, applying a program voltage $V_{pgm}$ (e.g., a positive voltage pulse between 10 V and 20 V) on control gate 333, and grounding the corresponding bit line 341. As a result, charge carriers (e.g., electrons) can be injected into the memory film of memory cell 340, thereby increasing the threshold voltage $V_{th}$ of memory cell 340. Accordingly, memory cell 340 can be programmed to the programmed state P1 ("state P1" or logic "0").

In some embodiments, the state of the memory cell (e.g., state ER or state P1) can be determined by measuring or sensing the threshold voltage $V_{th}$ of the memory cell. During a read operation, a read voltage $V_{read}$ can be applied on control gate 333 of the memory cell and current flowing through the memory cell can be measured at bit line 341. A pass voltage $V_{pass}$ can be applied on unselected word lines to switch on unselected memory cells.

In some embodiments, a NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores 1 bit and has two logic states, logic {1 and 0}, i.e., states ER and S1. In the MLC mode, a memory cell stores 2 bits, and has four logic states, logic {11, 10, 01, and 00}, i.e., states ER, M1, M2, and M3. In the TLC mode, a memory cell stores 3 bits, and has eight logic states, logic {111, 110, 101, 100, 011, 010, 001, 000}, i.e., states ER, and states T1-T7. In the QLC mode, a memory cell stores 4 bits and has 16 logic states, logic {1111, 1110, 1101, 1100, 1011, 1010, 1001, 1000, 0111, 0110, 0101, 0100, 0011, 0010, 0001, 0000}, i.e., states ER, and states Q1-Q15. Memory controller 20 of storage system 10 (see FIG. 1) can convert data received from host computer 15 into corresponding logic states of the memory cells on memory dies 100 and vice versa.

Figure 6:
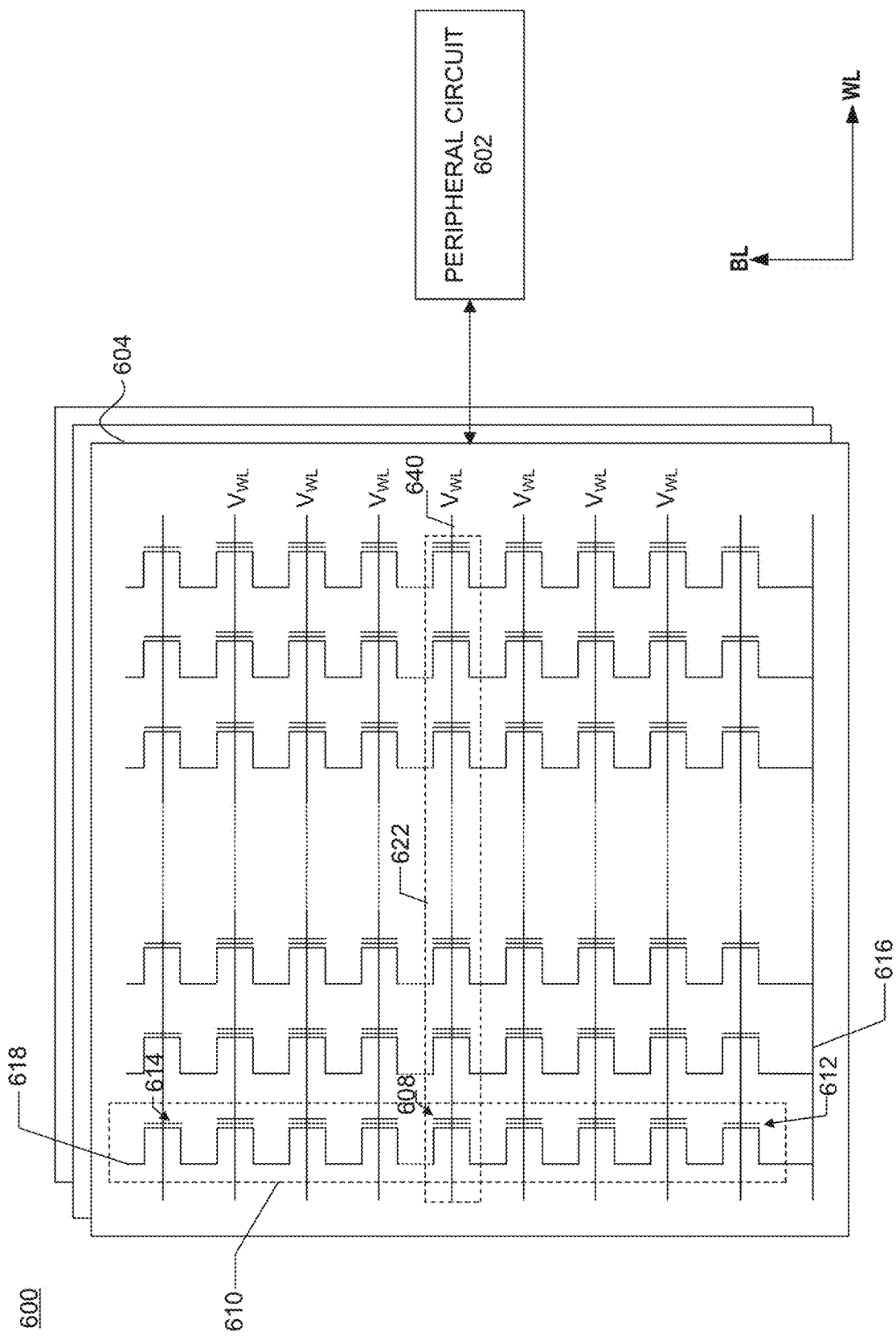
FIG. 6 illustrates an example schematic circuit diagram of a memory device, according to some embodiments.

FIG. 6 illustrates an example schematic circuit diagram 600 of a memory device, according to aspects of the present disclosure. The example schematic circuit diagram 600 includes a memory block 604 and a peripheral circuit 602. In some aspects, the example schematic circuit diagram 600 includes a plurality of memory strings 610, each memory string 610 having a plurality of memory cells 608. The memory string 610 also includes at least one field effect transistor (e.g., MOSFET) at each end, which is controlled by a lower select gate (LSG) 612 and a top select gate (TSG) 614, respectively. The memory cell 608 can be controlled by a control gate, where the control gate can be connected to a word line 640 of the example schematic circuit diagram 600. The drain terminal of the TSG 614 can be connected to the bit line 618, and the source terminal of the LSG 612 can be connected to an array common source (ACS) 616. The ACS 616 can be shared by the memory strings 610 in an entire memory block, and is also referred to as the common source line.

In some aspects, the example schematic circuit diagram 600 can be formed based on the floating gate technology. In some aspects, the example schematic circuit diagram 600 can be formed based on charge trapping technology. The NAND flash memory based on charge trapping can provide high storage density and high intrinsic reliability. Storage data or logic states (e.g., threshold voltage $V_{th}$ of the memory cell 608) depends on the amount of charge trapped in a storage layer. In some aspects, the memory block 604 can be a three-dimensional (3D) memory device, and the example schematic circuit diagram 600 can be a 3D memory array, where the memory cells 608 can be vertically stacked on top of each other.

In a NAND memory, the memory cell 608 can be in an erase state ER or a programmed state P1. Initially, all memory cells 608 in the example schematic circuit diagram 600 can be reset to the erase state ER as logic "1" by implementing a negative voltage difference between control gates and source terminals of the memory cells (e.g., the array common source 616) such that all the trapped electronic charges in the storage layer of the memory cells 608 can be removed. For example, the negative voltage difference can be induced by setting the control gates of the memory cells 608 to ground, and applying a high positive voltage to the array common source 616. At the erase state ER ("state ER"), the threshold voltage $V_{th}$ of the memory cells 608 can be reset to the lowest value, and can be measured or sensed at the bit line 618.

During programming (i.e., writing), a programming voltage $V_{pgm}$ (e.g., a positive voltage pulse between 10 V and 20 V) can be applied on the control gate such that electronic charges (e.g., electrons) can be injected into the storage layer of the memory cell 608, and thereby increase the threshold voltage $V_{th}$ of the memory cell 608. Thus the memory cell 608 is programmed to the state P1.

A NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores "1" bit and has two logic states ("states"), i.e., states ER and P1. In the MLC mode, a memory cell stores 2 bits, and has four states, i.e., states ER, P1, P2, and P3. In the TLC mode, a memory cell stores 3 bits, and has eight states, i.e., states ER, and states P1-P7. In the QLC mode, a memory cell stores 4 bits and has 16 states.

Figure 7:
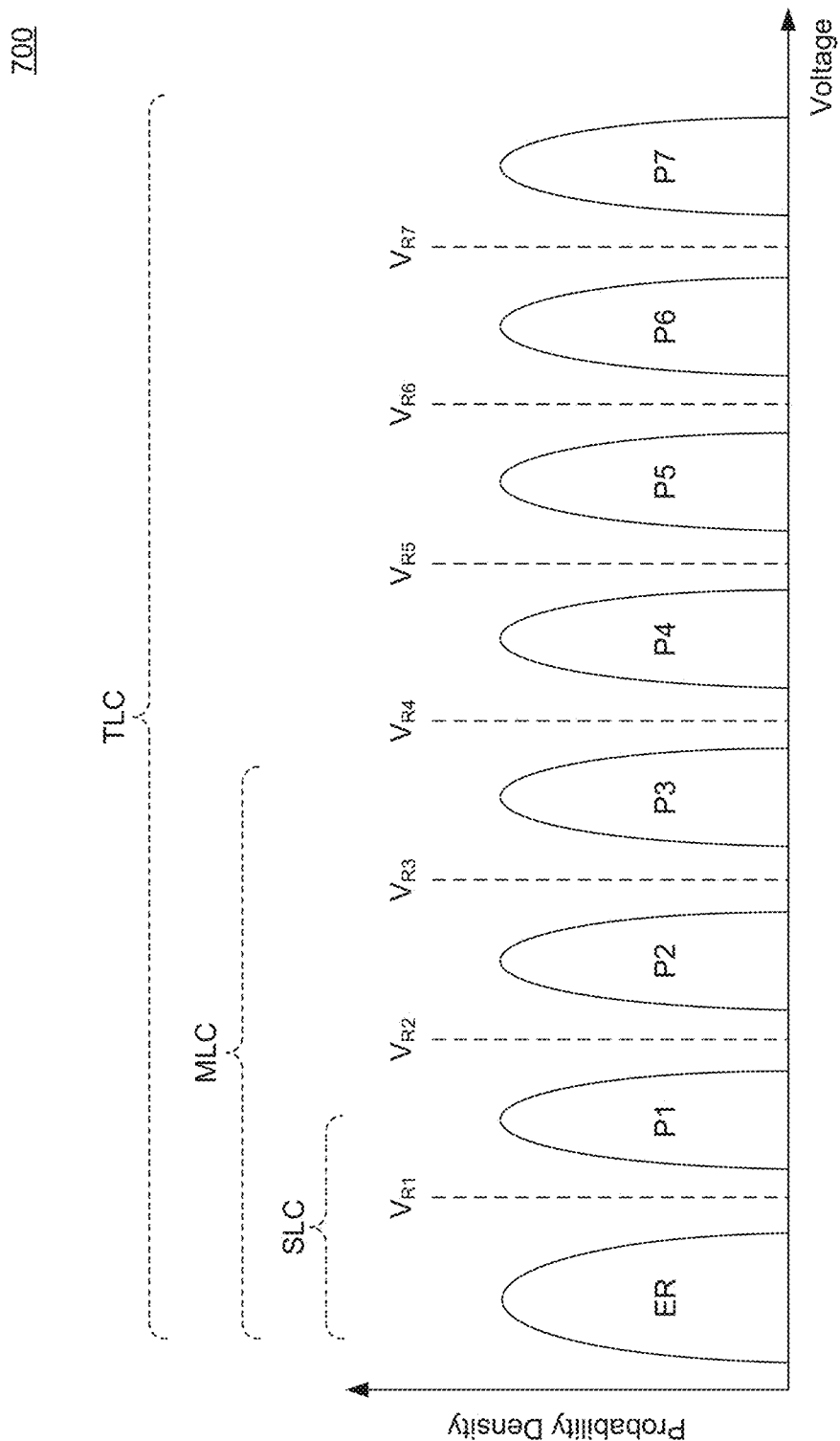
FIG. 7 illustrates a threshold voltage $V_{th}$ distribution of a NAND flash memory programmed in the SLC, MLC, or TLC modes, according to some embodiments.

FIG. 7 illustrates a threshold voltage $V_{th}$ distribution of a NAND flash memory programmed in the SLC, MLC, or TLC modes, according to some embodiments. In some embodiment of the SLC mode, state P1 corresponds to state S1. In some embodiment of the MLC mode, states P1-P3 corresponds to states M1-M3. In some embodiment of the TLC mode, states P1-P7 corresponds to states T1-T7. In some embodiments, each state of the memory cells can correspond to a specific range of threshold voltage $V_{th}$, where the threshold voltage $V_{th}$ distribution of each state can be represented by a probability density. In some embodiments, the states other than the erased state ER can be programmed by using an incremental step pulse programming (ISPP) scheme where the programming voltage $V_{pgm}$ can be incrementally increased by adding a step pulse $V_{step}$. For example, the eight TLC states can be programmed from state ER with a lower threshold voltage to state T7 with a highest threshold voltage.

In some embodiments, after programming, the eight TLC states ER and T1-T7 can be verified by using one or more read reference voltages $V_{R1}$-$V_{R7}$ during a verification process. By applying one or more of the read reference voltages $V_{R1}$-$V_{R7}$ to the control gate of a target memory cell, the range of the memory cell's threshold voltage $V_{th}$ can be determined. For example, to verify if a memory cell is at state ER, the read reference voltage $V_{R1}$ can be used. If the target memory cell is at state ER, the threshold voltage $V_{th}$ of the target memory cell is lower than the read reference voltage $V_{R1}$. The target memory cell can be switch on and form a conductive path in the channel. If the target memory cell is at any one of the states T1-T7, the threshold voltage $V_{th}$ of the target memory cell is higher than the read reference voltage $V_{R1}$. The target memory cell is thereby switched off. By measuring or sensing the current through the target memory cell at the corresponding bit line, via the page buffer/sense amplifier 50, the threshold voltage $V_{th}$ or the state of the target memory cell can be verified.

In some embodiments, as described above, to determine the two states ER and S1 stored in the SLC mode, it is sufficient to rely on just the read reference voltage $V_{R1}$. To determine the four states ER and M1-M3 in the MLC mode, the read reference voltages $V_{R1}$, $V_{R2}$ and $V_{R3}$ can be used. To determine the eight states ER and T1-T7 for the TLC mode, the read reference voltages $V_{R1}$-$V_{R7}$ can be used. For example, in the TLC mode, the threshold voltage of state ER is below $V_{R1}$, and the threshold voltage of state T7 is above $V_{R7}$, where the threshold voltages of state T1 is between $V_{R1}$ and $V_{R2}$. States T2-T6 can be determined similarly.

FIG. 8A illustrates an example method 800 of programming using an incremental step pulse programming (ISPP) scheme, according to some embodiments. FIG. 8A can be described with regard to elements of FIGS. 1-6. The example method 800 can be performed by a memory system (for example, the memory system 102 of FIG. 1). It should be appreciated that the example 800 is not exhaustive and that other operation steps can be performed as well before, after, or between any of the illustrated operation steps. In some embodiments, some operation steps of the example 800 can be omitted or other operation steps can be included, which are not described here for simplicity. In some embodiments, operation steps of the example 800 can be performed in a different order and/or vary.

In some aspects, during programming, the memory device can apply different programming voltages to memory cells to program the memory cells into different states. For example, as shown in FIG. 7, the memory cell may have a target state of the state P1. In such a case, the memory device can apply a programming voltage 802 to a WL associated with the memory cell to program the memory cell to the state P1. As shown in FIG. 7, a voltage range corresponds to the state P1 in the programming. Therefore, the memory device applies a reference voltage 804 to verify whether the threshold voltage of the memory cell satisfies the voltage range. If the threshold voltage of the memory cell satisfies the voltage range, the programming of the memory cell is complete. In some aspects, the memory device inhabits the memory cell for the programming. Thus, the memory device will not apply programming voltages to the memory cell in further programming. On the other hand, if the threshold voltage of the memory cell does not satisfy the voltage range, the memory device increases the programming voltage by a step pulse and applies the increased programming voltage to the WL associated with the memory cell. For example, the memory device increases the programming voltage 802 to a program voltage 806 by a step pulse, such as ISPP step. The memory device then applies the programming voltage 806 to the WL associated with the memory cell, after which the memory device verifies whether the threshold of the memory cell satisfies the voltage range. The memory device repeats the programming process until the threshold of the memory device satisfies the voltage range. The programming operations that apply the programming voltage in an incremental manner as discussed above are also referred to as ISPP.

In some aspects, the memory device may program the memory cell using multi-stage programming operations. For example, the memory device may perform coarse programming to program the memory cell to an intermediate threshold voltage. The memory device then performs fine programming to program the memory cell to a desired threshold voltage.

Figure 8B:
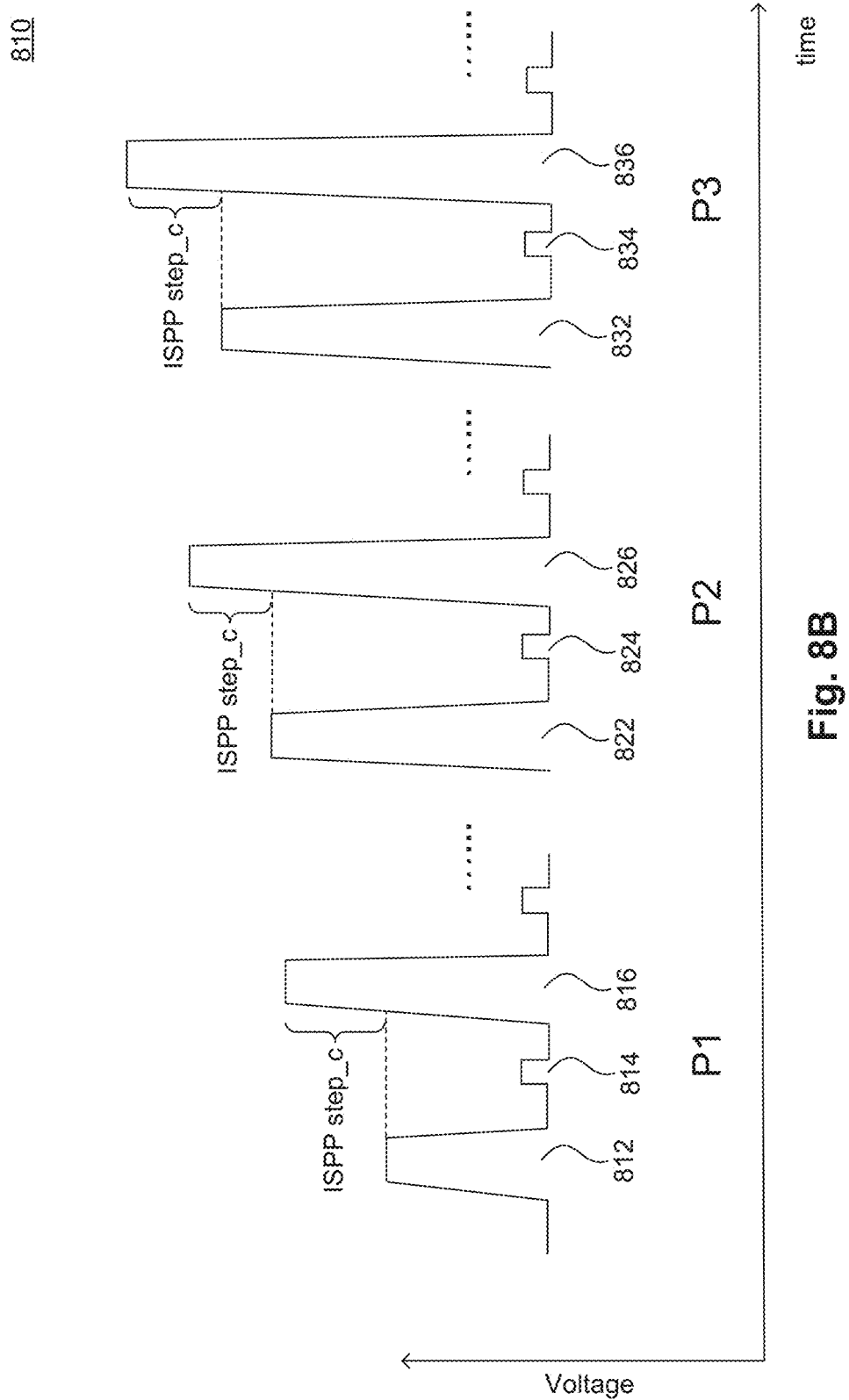
FIG. 8B illustrates an example method 810 of coarse programming, according to aspects of the present disclosure.

FIG. 8B illustrates an example 810 of coarse programming, according to aspects of the present disclosure. FIG. 8B can be described with regard to elements of FIGS. 1-6. The example method 810 can be performed by a memory system (for example, the memory system 102 of FIG. 1). It should be appreciated that the example 810 is not exhaustive and that other operation steps can be performed as well before, after, or between any of the illustrated operation steps. In some embodiments, some operation steps of the example 810 can be omitted or other operation steps can be included, which are not described here for simplicity. In some embodiments, operation steps of the example 810 can be performed in a different order and/or vary.

In some aspects, during coarse programming, the memory device can apply different programming voltages to memory cells to program the memory cells into different states. For example, as shown in FIG. 8B, the memory cell may have a target state of the state P1. In such a case, the memory device can apply a programming voltage 812 to the memory cell to program the memory cell to the state P1. In some examples, the memory device applies a reference voltage 814 to verify whether the threshold voltage of the memory cell satisfies the voltage range. If the threshold voltage of the memory cell satisfies the voltage range, the coarse programming of the memory cell is complete. In some aspects, the memory device inhabits the memory cell for the coarse programming. Thus, the memory device will not apply programming voltages to the memory cell in further coarse programming. On the other hand, if the threshold voltage of the memory cell does not satisfy the voltage range, the memory device increases the programming voltage by a step pulse and applies the increased programming voltage to the memory cell. For example, the memory device increases the programming voltage 812 to a program voltage 816 by a step pulse, such as ISPP step_c. The memory device then applies the programming voltage 816 to the memory cell, after which the memory device verifies whether the threshold of the memory cell satisfies the voltage range. The memory device repeats the programming process until the threshold of the memory device satisfies the voltage range. The programming operations that apply the programming voltage in an incremental manner as discussed above are also referred to as ISPP.

In some aspects, the target state of the memory cell can be the state P2. In such a case, the memory device can apply a programming voltage 822 to the memory cell to program the memory cell to the state P2. In some examples, the voltage range corresponding to the state P2 may include higher voltage values compared with the state P1. Thus, the programming voltage 822 is larger than the programming voltage 812. In some aspects, similar to the state P1, a second voltage range corresponds to the state P2 in the coarse programming. Therefore, the memory device can apply a reference voltage 824 to verify whether the threshold voltage of the memory cell satisfies the second voltage range. If the threshold voltage of the memory cell satisfies the second voltage range, the coarse programming of the memory cell is complete. In some aspects, the memory device inhibits the memory cell for the coarse programming. Thus, the memory device will not apply programming voltages to the memory cell in further coarse programming. On the other hand, if the threshold voltage of the memory cell does not satisfy the second voltage range, the memory device can increase the programming voltage by a step pulse and applies the increased programming voltage to the memory cell. For example, the memory device increases the programming voltage 822 to a program voltage 826 by a step pulse, such as ISPP step_c. The memory device then applies the programming voltage 826 to the memory cell, after which the memory device verifies whether the threshold of the memory cell satisfies the second voltage range. The memory device repeats the programming process until the threshold of the memory device satisfies the second voltage range. In some aspects, the step pulse of programming the memory cell to the P1 state is the same as the step pulse of programming the memory cell to the P2 state. In other words, the coarse programming uses ISPP with a fixed step pulse, e.g., ISPP step_c of FIG. 8B.

In some aspects, the target state of the memory cell can be the state P3. In such a case, the memory device can apply a programming voltage 832 to the memory cell to program the memory cell to the state P3. Similar to the states P1 and P2 discussed above, a third voltage range corresponds to the state P3 in the coarse programming. Therefore, the memory device can apply a reference voltage 834 to verify whether the threshold voltage of the memory cell satisfies the third voltage range. If the threshold voltage of the memory cell does not satisfy the third voltage range, the memory device can increase the programming voltage by a step pulse and applies the increased programming voltage to the memory cell. For example, the memory device increases the programming voltage 832 to a program voltage 836 by a step pulse, such as ISPP step_c. The memory device then applies the programming voltage 836 to the memory cell, after which the memory device verifies whether the threshold of the memory cell satisfies the third voltage range. The memory device repeats the programming process until the threshold of the memory device satisfies the third voltage range.

FIG. 8C illustrates an example 840 of fine programming, according to aspects of the present disclosure. FIG. 8C can be described with regard to elements of FIGS. 1-6. The example method 840 can be performed by a memory system (for example, the memory system 102 of FIG. 1). It should be appreciated that the example 840 is not exhaustive and that other operation steps can be performed as well before, after, or between any of the illustrated operation steps. In some embodiments, some operation steps of the example 840 can be omitted or other operation steps can be included, which are not described here for simplicity. In some embodiments, operation steps of the example 840 can be performed in a different order and/or vary.

In some aspects, during fine programming, the memory device can apply different programming voltages to memory cells to program the memory cells into different states. Similar to the coarse programming discussed in FIG. 8B, the memory device applies programming voltages 842, 852, or 862 to the memory cell. The memory device then verifies using references voltages 844, 854, or 864. If the memory cell fails to satisfy required states P1, P2, or P3, the memory device increases the programming voltages by ISPP step_f, which is different from ISPP step_c, and repeats the programming process until the memory cell satisfies the required states.

Figure 9:
FIG. 9 illustrates an example process flow of performing a programming operation on a memory cell, according to some aspects of the disclosure.

FIG. 9 illustrates an example process flow of performing a programming operation on a memory cell, according to some aspects of the disclosure. FIG. 9 can be described with regard to elements of FIGS. 1-8. The example 900 can be performed by a storage system (for example, the storage system 10 of FIG. 1). It should be appreciated that the process flow 900 is not exhaustive and that other operation steps can be performed as well before, after, or between any of the illustrated operation steps. In some embodiments, some operation steps of the process flow 900 can be omitted or other operation steps can be included, which are not described here for simplicity. In some embodiments, operation steps of the process flow 900 can be performed in a different order and/or vary.

In some embodiments, a programming operation can be performed on a memory cell (e.g., memory cell 608). The memory cell can be connected to a bit line (e.g., bit line 618) and is controlled by a word line (e.g., word line 640).

At operation step 902, a first programming voltage signal is applied to the word line to program the memory cell into a first state. For example, the first state may include a P7 state.

At operation step 904, a first voltage is applied to the bit line. In some examples, the first voltage can include a voltage larger than zero voltage.

At operation step 906, a verify operation is performed when the memory cell is in a second state. In some examples, a target voltage of the second state can be lower than the target voltage of the first state. For example, the second state may include a P3 state. In some examples, performing the verify operation can include comparing a threshold voltage of the memory cell with a read reference voltage. In some examples, the read reference voltage can be a verify voltage of the second state.

At operation step 908, a classification of the memory cell is determined based on the verify operation. In some examples, the classification of the memory cell can be determined as a first classification when the threshold voltage is larger than the read reference voltage. Alternatively, the classification of the memory cell can be determined as a second classification when the threshold voltage is smaller than the read reference voltage. In some examples, a memory cell in the first classification may include a memory cell with a high programming speed and a memory cell in the second classification may include a memory cell with a low programming speed.

At operation step 910, a second voltage is applied to the bit line based on the determined classification. In some examples, the second voltage can be applied so as to be equal to the first voltage based on the determined first classification of the memory cell. Alternatively, the second voltage can be applied so as to be equal to a zero voltage based on the determined second classification of the memory cell.

At operation step 912, a second programming voltage signal is applied to the word line to program the memory cell into the first state. In some examples, the second programming voltage signal can be applied to perform coarse programming to program the memory cell to an intermediate threshold voltage.

At operation step 914, a third voltage is applied to the bit line. In some examples, the third voltage is larger than the second voltage.

At operation step 916, a third programming voltage signal is applied to the word line to program the memory cell into the first state. In some examples, the third programming voltage signal can be applied to perform fine programming to program the memory cell to a desired threshold voltage of the first state.

At operation step 918, a fourth voltage is applied to the bit line. In some examples, the fourth voltage can be applied to inhibit the memory cell.

Currently, the programming speed of different cells is different due to, for example, variations in fabrication processes. Among all the memory cells that need to be programmed to the highest target state, the cell with the slowest programming speed may limit the minimum number of programming pulses. Among all the cells that need to be programmed to the same target state, the difference in programming speed between the cell with the slowest programming speed and the cell with the fastest programming speed may determine the number of verify loop counts required to program to the target state.

In the present disclosure, during a programming operation of a memory cell, a first voltage applied to the bit line can include a voltage larger than zero voltage. The voltages applied to the bit line subsequently can be dynamically adjusted based on the classification of the memory cell. Among others, two advantages with the present disclosure can include: (1) when the target state of the programming operation is the highest state, the maximum programming pulse data can be reduced to reduce the time to perform programming operations and improve writing speed; (2) when the target state of the programming operation is lower than the highest state, verify loop counts can be reduced to reduce the time to perform programming operations and improve writing speed.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way. The breadth and scope of the present disclosure should not be limited by any of the above-described exemplary embodiments, but should be defined only in accordance with the following claims and their equivalents.

What is claimed is:

1. A method for programming a memory device, the method comprising:
  performing a programming operation on a memory cell, wherein the memory cell is connected to a bit line and is controlled by a word line, wherein performing the programming operation comprises:
    applying a first programming voltage signal to the word line to program the memory cell into a first programmed state;
    applying a first voltage to the bit line;
    subsequent to the applying the first voltage, performing a verify operation when the memory cell is in a second programmed state different from the first programmed state, wherein a second verify voltage of the second programmed state is lower than a first verify voltage of the first programmed state;
    determining a classification of the memory cell based on the verify operation;
    applying a second voltage to the bit line based on the determined classification;

applying a second programming voltage signal to the word line to program the memory cell into the first programmed state;
applying a third voltage to the bit line;
applying a third programming voltage signal to the word line to program the memory cell into the first programmed state; and
applying a fourth voltage to the bit line.

2. The method of claim 1, wherein the applying the first voltage comprises applying a voltage larger than zero.

3. The method of claim 1, wherein a target voltage of the second programmed state is lower than a target voltage of the first programmed state.

4. The method of claim 1, wherein performing the verify operation comprises comparing a threshold voltage of the memory cell with a read reference voltage, wherein the read reference voltage is the second verify voltage of the second programmed state.

5. The method of claim 4, wherein the determining the classification of the memory cell based on the verify operation comprises:
determining a classification of the memory cell as a first classification when the threshold voltage is larger than the read reference voltage, or
determining a classification of the memory cell as a second classification when the threshold voltage is smaller than the read reference voltage.

6. The method of claim 5, wherein the applying the second voltage is applied so as to be equal to the first voltage based on the determined first classification of the memory cell, or as a zero voltage based on the determined second classification of the memory cell.

7. The method of claim 1, wherein the third voltage is larger than the second voltage.

8. A three-dimensional (3D) NAND memory device, comprising:
a NAND string including a cell to be inhibited to program;
a word line driver;
a bit line driver; and
a controller configured to control the word line driver and the bit line driver to:
apply a first programming voltage signal to a word line to program a memory cell into a first programmed state;
apply a first voltage to a bit line;
subsequent to the applying the first voltage, perform a verify operation when the memory cell is in a second programmed state different from the first programmed state, wherein a second verify voltage of the second programmed state is lower than a first verify voltage of the first programmed state;
determine a classification of the memory cell based on the verify operation;
apply a second voltage to the bit line based on the determined classification;
apply a second programming voltage signal to the word line to program the memory cell into the first programmed state;
apply a third voltage to the bit line;
apply a third programming voltage signal to the word line to program the memory cell into the first programmed state; and
apply a fourth voltage to the bit line.

9. The 3D NAND memory device of claim 8, wherein the applying the first voltage comprises applying a voltage larger than zero.

10. The 3D NAND memory device of claim 8, wherein a target voltage of the second programmed state is lower than a target voltage of the first programmed state.

11. The 3D NAND memory device of claim 8, wherein performing the verify operation comprises comparing a threshold voltage of the memory cell with a read reference voltage, wherein the read reference voltage is the second verify voltage of the second programmed state.

12. The 3D NAND memory device of claim 11, wherein the determining the classification of the memory cell based on the verify operation comprises:
determining a classification of the memory cell as a first classification when the threshold voltage is larger than the read reference voltage, or
determining a classification of the memory cell as a second classification when the threshold voltage is smaller than the read reference voltage.

13. The 3D NAND memory device of claim 12, wherein the applying the second voltage is applied so as to be equal to the first voltage based on the determined first classification of the memory cell, or as a zero voltage based on the determined second classification of the memory cell.

14. The 3D NAND memory device of claim 8, wherein the third voltage is larger than the second voltage.

15. A non-transitory medium having instructions stored thereon that, upon execution by at least one controller, cause the at least one controller to perform a method of performing a programming operation of a memory device, the method comprising:
applying a first programming voltage signal to a word line to program a memory cell into a first programmed state;
applying a first voltage to a bit line;
subsequent to the applying the first voltage, performing a verify operation when the memory cell is in a second programmed state different from the first programmed state, wherein a second verify voltage of the second programmed state is lower than a first verify voltage of the first programmed state;
determining a classification of the memory cell based on the verify operation;
applying a second voltage to the bit line based on the determined classification;
applying a second programming voltage signal to the word line to program the memory cell into the first programmed state;
applying a third voltage to the bit line;
applying a third programming voltage signal to the word line to program the memory cell into the first programmed state; and
applying a fourth voltage to the bit line.

16. The non-transitory medium of claim 15, wherein the applying the first voltage comprises applying a voltage larger than zero.

17. The non-transitory medium of claim 15, wherein a target voltage of the second programmed state is lower than a target voltage of the first programmed state.

18. The non-transitory medium of claim 15, wherein performing the verify operation comprises comparing a threshold voltage of the memory cell with a read reference voltage, wherein the read reference voltage is the second verify voltage of the second programmed state.

19. The non-transitory medium of claim 18, wherein the determining the classification of the memory cell based on the verify operation comprises:
determining a classification of the memory cell as a first classification when the threshold voltage is larger than the read reference voltage, or determining a classification of the memory cell as a second classification when the threshold voltage is smaller than the read reference voltage.

20. The non-transitory medium of claim 19, wherein the applying the second voltage is applied so as to be equal to the first voltage based on the determined first classification of the memory cell, or as a zero voltage based on the determined second classification of the memory cell.

\* \* \* \* \*